United States Patent [19]

Allred

[11] 4,001,698

[45] Jan. 4, 1977

[54] ANALOG TIMER INCLUDING CONTROLLABLE OPERATE-RECOVERY TIME CONSTANTS

[75] Inventor: Ralph Rabun Allred, Greensboro, N.C.

[73] Assignee: Bell Telephone Laboratories, Incorporated, Murray Hill, N.J.

[22] Filed: Oct. 31, 1975

[21] Appl. No.: 627,478

[52] U.S. Cl. .................................. 328/55; 307/229; 307/293; 328/127

[51] Int. Cl.$^2$ .......................................... H03K 5/159

[58] Field of Search ............. 307/229, 293; 328/55, 328/129, 127, 143

[56] References Cited

UNITED STATES PATENTS

| | | | |
|---|---|---|---|
| 3,836,791 | 9/1974 | Galloway | 307/293 |
| 3,889,197 | 6/1975 | Duff | 328/55 |
| 3,914,623 | 10/1975 | Clancy | 307/229 |
| 3,943,456 | 3/1976 | Luce | 328/127 |

*Primary Examiner*—Stanley D. Miller, Jr.
*Attorney, Agent, or Firm*—Thomas Stafford

[57] ABSTRACT

An analog timer circuit including an operational amplifier integrator and a voltage comparator is employed to yield time delayed pulse signals. The timer period is based on the linear integration rate of the integrator circuit with the comparator circuit sensing changes in the magnitude of the potential developed at an inverter input of the integrator operational amplifier which exceed predetermined threshold levels to initiate and terminate generation of a pulse. Pulse position and pulse width errors in the timer output are minimized by controlling the integration rate of the integrator.

8 Claims, 12 Drawing Figures

ANALOG TIMER INCLUDING CONTROLLABLE OPERATE-RECOVERY TIME CONSTANTS

BACKGROUND OF THE INVENTION

This invention relates to electronic timing circuits and, more particularly, to pulse generation circuits for providing output pulse signals which occur some predetermined time interval after the applied input pulse signals.

There are numerous applications in which it is either necessary or desirable to delay an applied signal. For example, in circuits which perform a plurality of operations in a predetermined time sequence in response to a single input signal a plurality of timer circuits has heretofore most often been utilized to insure that each operation occurs at a predetermined time interval after application of the input signal. In many applications it is also necessary, in addition to delaying operation of a function, to delay termination of that function. For example, it may be necessary to delay enabling a particular relay for a predetermined interval after application of an input pulse signal and also to delay disabling or releasing the relay by a similar or different predetermined time interval after the input pulse signal has terminated.

Many circuits are known which introduce time delays to applied signals. These circuits vary in complexity from the simple monostable multivibrator to more complex circuit arrangements which precisely generate a plurality of delayed signals. In applications requiring both an operate and release delay, it has been common practice to employ a separate timer for generating each desired delay. Consequently, both circuit complexity and cost are thereby increased. Another limitation of many known timer circuits is the inability to maintain the desired timing sequence when an applied input signal is momentarily interrupted because of spurious discontinuities, i.e., noise or the like.

One analog timer circuit which has been advantageously utilized to overcome limitations of prior art timers is disclosed in U.S. Pat. No. 3,889,197 issued to T. G. Duff on June 10, 1975. An operational amplifier integrator and a voltage comparator are interconnected to realize the analog timing circuit. Basically, the integrator integrates an applied input signal while the comparator detects the voltage at an inverting input of the integrator and switches the timer output voltage in response to changes in the "virtual ground" potential at the inverting input. That is, once the integrator amplifier has reached saturation potential, the inverting input potential deviates from virtual ground. The comparator threshold voltage is adjusted so that it responds to deviations in the potential at the inverter input. Desired time delays are obtained by setting the time constant of the integrator to yield corresponding integration rates. Some degree of insensitivity to spurious discontinuities, i.e., gaps, breaks or the like, in an applied signal is realized in certain applications in which the integrator integration rate is the same for both positive and negative input signals. Although this prior known timer is somewhat insensitive to spurious discontinuities in the applied input signal, problems arise in applications in which it is desirable to have unequal operate and release delay intervals and also in certain applications including equal operate and delay time intervals. For example, in one known application, it is important that the timer recover to an initial state rapidly upon "timing-out," i.e., once the applied signal is terminated. The desired operate and recovery intervals are realized by employing first and second integration rates, respectively. The first integration rate is effective during application of an applied signal, for example, a positive input and the second integration rate is effective during absence of the applied signal, for example, a negative input. When such first and second integration rates are employed in the timer disclosed in U.S. Pat. No. 3,889,197, breaks or gaps caused by noise or the like in the applied signal cause sharp discontinuities in a ramp signal developed by the integrator. Indeed, the rapid recovery rate employed in the prior timer may even cause the ramp signal developed by the integrator to return repetitively to an initial amplitude level. Consequently, the integrator output may never reach saturation potential and, hence, the comparator output would remain unchanged thereby not yielding an indication of the presence of an applied signal. Moreover, even if the integrator output does reach the desired saturation level, the resultant pulse output from the comparator will be substantially distorted both in pulse position and pulse width.

In another known application, it is desirable to have substantially equal operate and release delay intervals. The equal operate and release intervals are obtained in the prior timer by employing equal operate and recovery integration rates. Here again, breaks or gaps near the leading and trailing edges of an applied signal cause the prior analog timer to yield a pulse signal including pulse position and pulse width errors. These errors are again caused by the operate and recover time constants of the integrator circuit.

SUMMARY OF THE INVENTION

These and other problems in the prior known analog timer are overcome in accordance with the inventive principles herein to be described in an analog timer including an integrator circuit and a comparator circuit arranged to generate pulse signals having desired operate and release delay time intervals. Pulse position and pulse width errors encountered in prior timer arrangements are minimized by advantageously controlling the integration rate of the integrator with signals generated internal to the timer. Integration rate control is effected by employing a signal developed at the comparator output to enable and disable gate arrangements selectively to control changes in the charging and discharging time constants and, hence, the integration rate of the integrator.

BRIEF DESCRIPTION OF THE DRAWINGS

These and other objects and advantages of the invention will be more fully understood from the following detailed description and illustrative embodiments taken in connection with the appended drawings wherein.

DETAILED DESCRIPTION

Figure 1:
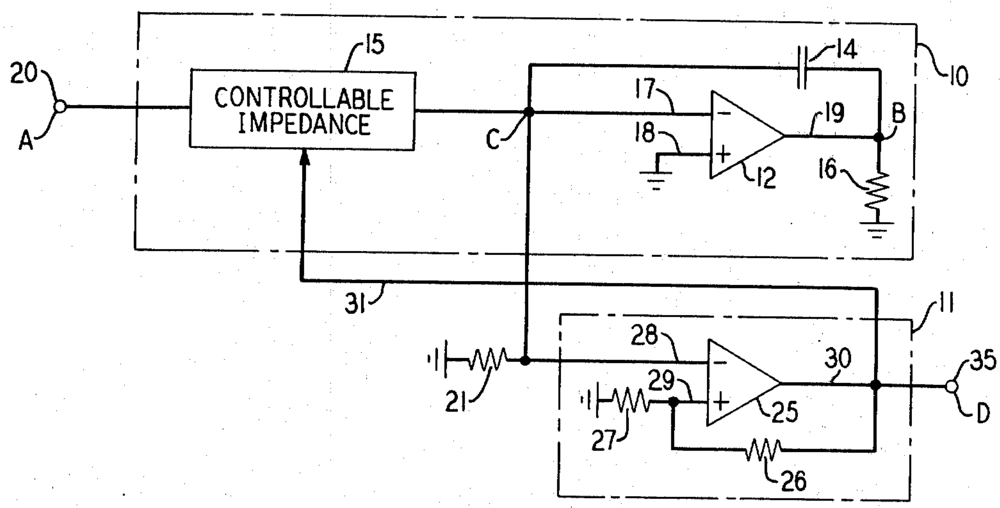
FIG. 1 shows in simplified form an analog timer illustrating the invention.

FIG. 1 illustrates in simplified form an analog timer employing the instant invention. Accordingly, shown are an operational amplifier integrator arrangement contained within dashed outline 10 and a comparator within dashed outline 11. Integrator 10 includes differential amplifier 12, capacitor 14, controllable impedance element 15 and load resistor 16. Amplifier 12 is a high gain type commonly referred to as an operational amplifier and includes inverting input 17, noninverting input 18 and output 19. Noninverting input 18 is connected to a reference potential point, for example, ground potential. Occasionally, input 18 is connected to ground via a resistive impedance element for purposes of compensating for direct current offset of amplifier 12. Capacitor 14 is connected between inverting input 17 and output 19. Load resistor 16 is connected between output 19 and ground potential and is employed to stabilize integrator 10. In some applications, resistor 16 may be eliminated. Controllable impedance element 15 is connected between inverting input 17 and timer input terminal 20. Inverting input 17 is connected via resistor 21 to a reference potential point, namely, ground potential. The impedance values of controllable impedance 15 and capacitor 14 determine the integration rate of integrator 10 in a manner known to those skilled in the art.

Comparator 11 includes differential amplifier 25 and resistors 26 and 27. Amplifier 25 is also a high gain type commonly referred to as an operational amplifier and includes inverting input 28, noninverting input 29 and output 30. Resistor 26 is connected between output 30 and noninverting input 29, while resistor 27 is connected between noninverting input 29 and a reference potential point, for example, ground potential. Output 30 of amplifier 25 is also connected to timer output terminal 35 and via circuit path 31 to controllable impedance 15. Resistors 26 and 27 form a voltage divider for establishing threshold levels for comparator 11. Inverting input 28 of amplifier 25 is connected in circuit with inverting input 17 of amplifier 12.

Figure 2:
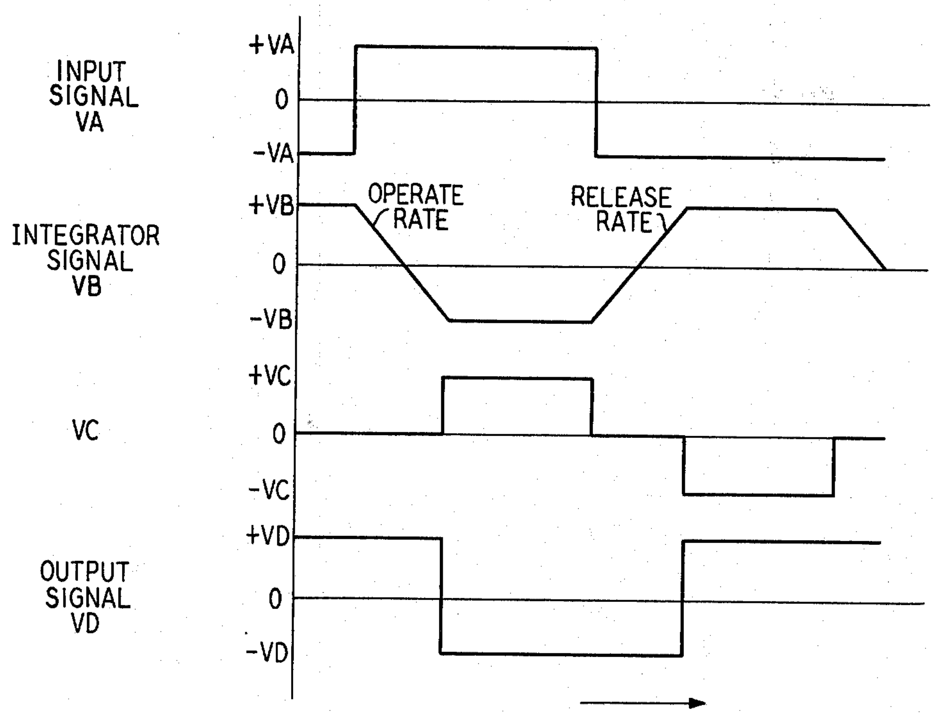
FIG. 2 depicts a sequence of waveforms useful in describing operation of a basic analog timer employed in FIG. 1.

Assuming, for the moment, that controllable impedance element 15 is replaced by a fixed resistance and circuit path 31 is open circuited, the timer arrangement of FIG. 1 reduces to the prior art analog timer described in U.S. Pat. No. 3,889,197. Operation of this prior art timer is illustrated by the waveforms shown in FIG. 2. Specifically, comparator 11 (FIG. 1) responds to changes in potential VC at inverting input 17 of amplifier 12 to yield pulse signal VD at output 35 having desired operate and release delay intervals determined by the integration rate of integrator 10. Since in this example the impedance of element 15 is the same for application of both positive and negative input signals, the operate and release intervals are the same. Output VD of comparator 11 is initially in a predetermined state, for example, positive saturation potential +VD and remains in that state until integrator 10 response VB reaches saturation potential −VB at which time potential VC at inverting input 17 changes from virtual ground potential to +VC. Since the magnitude of potential VC developed at inverting input 17 exceeds the threshold at noninverting input 29 of amplifier 25 determined by resistors 26 and 27 of comparator 11, output VD of comparator 11 switches to negative saturation potential −VD. Output VD of comparator 11 remains at negative saturation potential −VD until potential VC at inverting input 17 switches to −VC thereby exceeding the new threshold determined by output potential −VD of amplifier 25 and resistors 26 and 27. Thus, as illustrated by the waveforms of FIG. 2, application of positive input signal +VA, causes potential VB developed across capacitor 14 of integrator 10 to change from some initial potential +VB at a constant linear rate to saturation potential −VB, of amplifier 12. Integrator output VB remains at saturation potential −VB until input VA changes from potential +VA to potential −VA, at which time capacitor 14 discharges through impedance 15 at a linear rate until positive saturation potential +VB of amplifier 12 is reached. At positive and negative saturation potentials +VB and −VB of amplifier 12, potential VC developed at inverter input 17 is negative step −VC and positive step, +VC, respectively. Comparator 11 responds to the changes in potential VC to yield the delayed output pulse as shown in output waveform VD of FIG. 2.

Operation of the basic prior art analog timer arrangement for applications in which the integration rate of integrator 10 is the same for both operate and release intervals and also in which the integration rate is different for operate and release intervals is further described in U.S. Pat. No. 3,889,197 noted above.

As indicated above, both pulse position and pulse width errors result in the output pulse developed by the prior art analog timer arrangements when the applied signal is characterized by intervals of undesirable signal characteristics, for example, gaps, breaks and the like caused by noise, relay chatter or other similar undesirable phenomena. These problems are more satisfactorily resolved in an embodiment of the invention as shown in FIG. 1 by advantageously employing controllable impedance element 15. Controllable impedance element 15 is arranged to respond to an applied signal supplied via terminal 20 and to the signal developed at output 35 from comparator 11 supplied via circuit path 31 for controllably changing or inhibiting changes in the integration rate of integrator 10 during intervals of undesirable signal characteristics.

Figure 3:
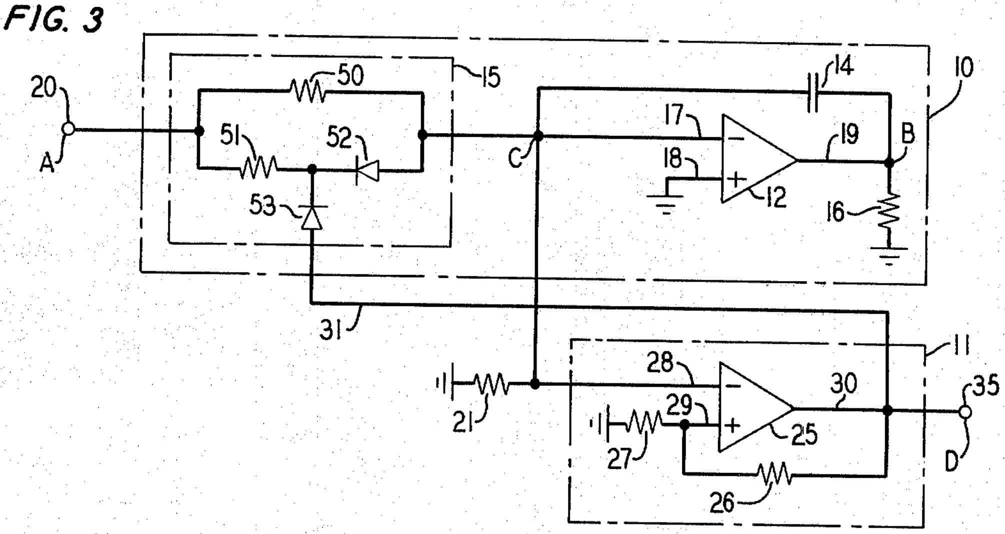
FIG. 3 shows a circuit diagram of one embodiment of the invention.

FIG. 3 illustrates an analog timer, in accordance with the invention, which has different operate and release delay intervals. Elements of the timer shown in FIG. 3, which perform the same functions as those employed in the timer shown in FIG. 1 have been similarly numbered and will not again be discussed in detail. FIGS. 4A through 4D illustrate a sequence of waveforms useful in describing operation of the embodiment of the invention shown in FIG. 3.

Figure 4A:
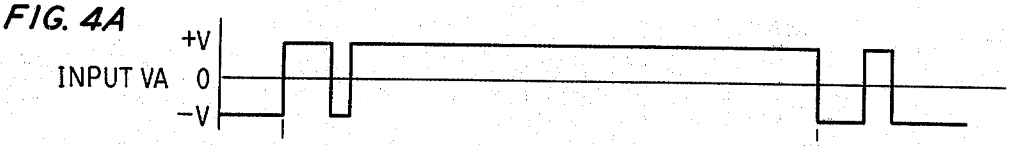
FIGS. 4A through 4D depict a sequence of waveforms useful in describing the operation of the timer of FIG. 3.
Figure 4B:
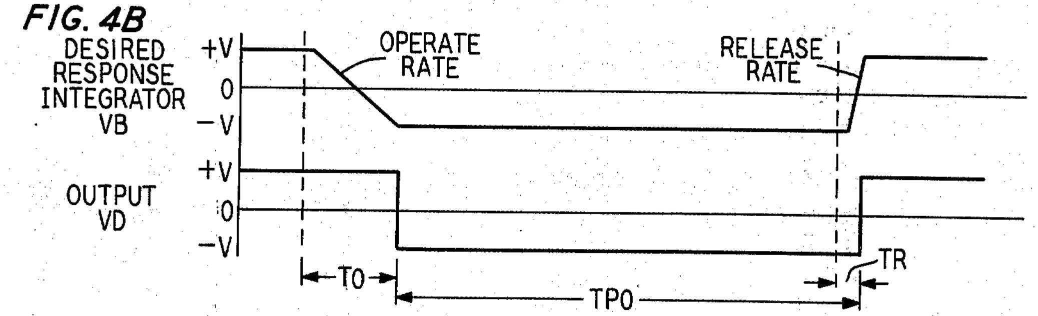
Figure 4C:
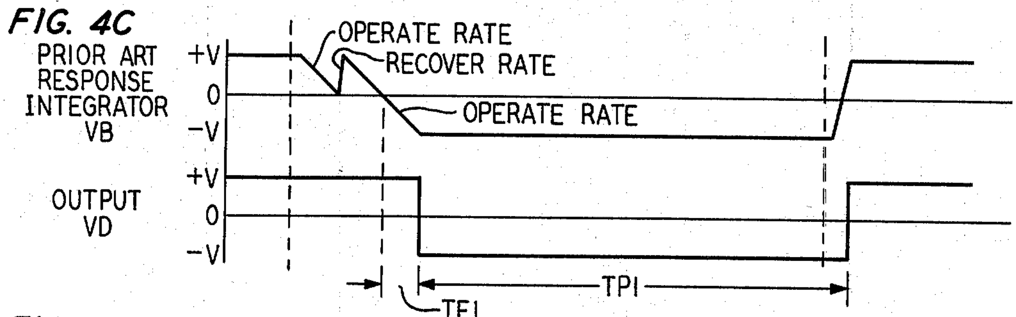

Accordingly, the operate delay interval initiated, in this example, by applying a positive signal to input terminal 20, is determined by the component values of resistor 50 and capacitor 14 in well-known fashion. Similarly, the release delay interval, initiated by removal of the positive input and by application of a negative signal to input 20, is determined by the component values of capacitor 14 connected in series with the parallel connection of resistor 50 and resistor 51. Resistor 51 is inhibited from being connected in parallel with resistor 50 during intervals in which a positive signal is applied to input 20. This is achieved by employing a switching element or unidirectional conductive element, for example, diode 52 which is poled to conduct only when a negative signal is applied to input 20. Assuming for the moment that diode 53 is not connected to the junction between resistor 51 and diode 52 and that an ideal input signal is applied to terminal 20, i.e., one without gaps, breaks or the like, the desired responses of integrator 10 and comparator 11 are shown as waveforms VB and VD, respectively, in FIG. 4B. However, in practice the applied signal typically includes gaps or breaks as illustrated by waveform VA of FIG. 4A. The prior art timer responds to the signal shown in VA of FIG. 4A to yield an output having both pulse position and pulse width errors as illustrated by the waveforms of FIG. 4C. The breaks in signal VA cause integrator response VB shown in FIG. 4C to return to an initial value, namely, +V. This is caused by resistor 51 being effectively connected in parallel with resistor 50 when the applied signal switches from positive to negative potential. For simplicity and ease of description, only one break is shown in signal VA, however, it should be understood that multiple breaks in signal VA may cause integrator response VB to return repetitively to initial output value +V. Consequently, integrator 10 may not reach negative saturation potential −V and comparator 11 would remain in its initial state, thereby not yielding an output pulse at all. In those situations that applied signal VA has breaks and integrator 10 does reach negative saturation potential the prior timer yields output VD having undesirable characteristics as shown in waveform VD of FIG. 4C. Specifically, operate delay interval TO is increased from the desired delay in waveform VD of FIG. 4B by error interval TE1 as shown in waveform VD of FIG. 4C. Additionally, output pulse width TP1 is decreased from the desired value TP0 of waveform VB of FIG. 4B by error interval TE1.

Figure 4D:
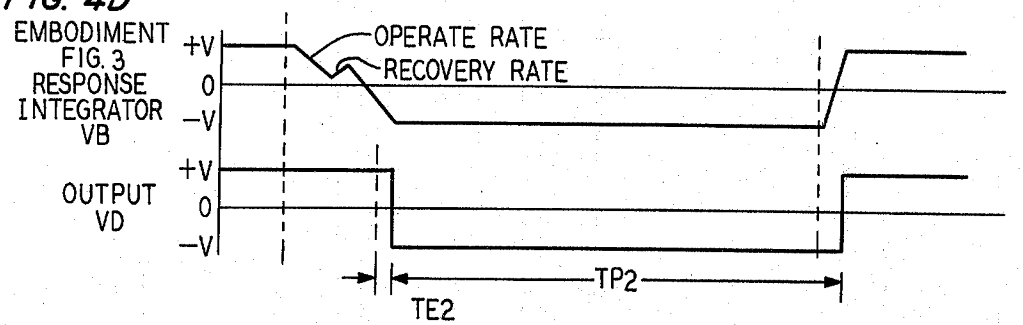

The pulse position and pulse width errors possible in the prior known timer arrangement are minimized in the embodiment of FIG. 3 by controllably inhibiting a change in the integration rate of integrator 10 unitl after integrator 10 has changed from a first saturation state to a second saturation state. In this example, the first or initial state of integrator 10 is positive saturation +V and the second state is negative saturation −V. These states could easily be reversed if desired. The desired inhibiting of a change in the integration rate, i.e., time constant of integrator 10 during the operate time interval is realized in the embodiment of the invention shown in FIG. 3 by advantageously employing a signal developed at the output of comparator 11 in conjunction with a switching or gating element to control changes in the value of impedance 15. In the instant embodiment, the output from comparator 11 is supplied via circuit path 31 to diode 53. In turn, diode 53 is connected to a circuit junction between resistor 51 and diode 52 and is poled to clamp that junction to a positive potential when the output of comparator 11 is positive. This clamping, in turn, back-biases diode 52 thereby effectively inhibiting connection of resistor 51 in parallel with resistor 50 when signal VA applied to input terminal 20 is a negative potential. Consequently, the integration rate of integrator 10 is controlled via the elements of controllable impedance 15 in conjunction with the output of comparator 11 to minimize pulse position and pulse width errors as illustrated in the waveform of FIG. 4D. Since the connection of resistor 51 in parallel with resistor 50 is inhibited via diode 53 during intervals in which the output of comparator 11 is positive, there can be no change in the integration rate of integrator 10 during the operate delay interval of the timer. Thus, when breaks occur in signal VA as shown in FIG. 4A during the operate interval response VB of integrator 10, as shown in waveform VB of FIG. 4D, does not change at the more rapid release integration rate as would have occurred in the prior art timer, as illustrated in waveform VB of FIG. 4C. Use of a slower integration rate, i.e., longer time constant, during intervals in which breaks occur in input signal VA results in less pulse position and pulse width error as indicated by interval TE2 of waveform VD of FIG. 4D. Once response VB of integrator 10 has reached negative saturation potential −V and output VD of comparator 11 has switched from +V to −V, diode 53 is inoperative and resistor 51 is connectable in parallel with resistor 50. Consequently, the integration rate of integrator 10 changes in response to signal VA becoming negative, thereby realizing desired rapid release time.

Figure 5:
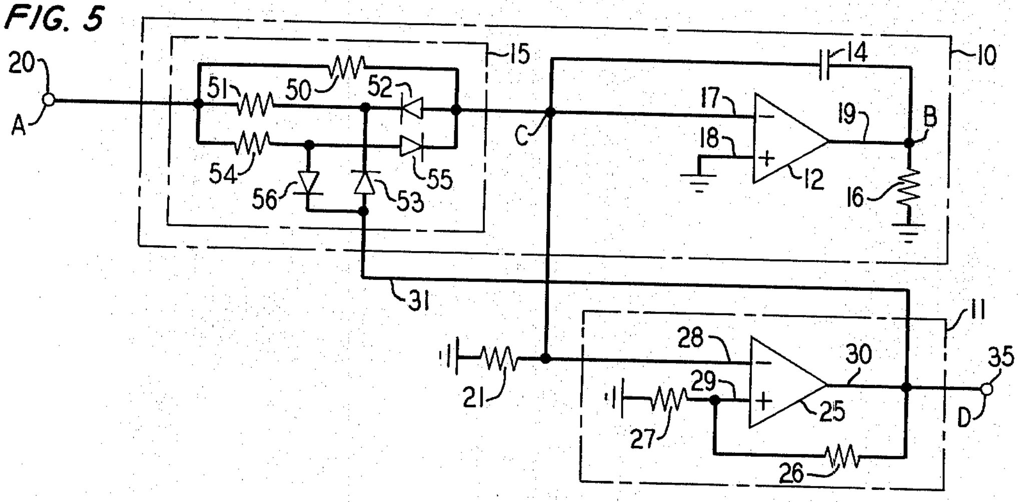
FIG. 5 depicts a circuit diagram of a second embodiment of the invention.

FIG. 5 shows an embodiment of the instant invention which may be advantageously utilized to minimize pulse position and pulse width errors in applications of the basic timer in which it is desirable to have substantially equal operate and release delay intervals. Elements employed in the embodiment of FIG. 5 which perform the same function as those used in the embodiments of FIGS. 1 and 3 are similarly numbered and will not be described in detail. FIGS. 6A through 6D show a sequence of waveforms useful in describing operation of the timer shown in FIG. 5.

Figure 6A:
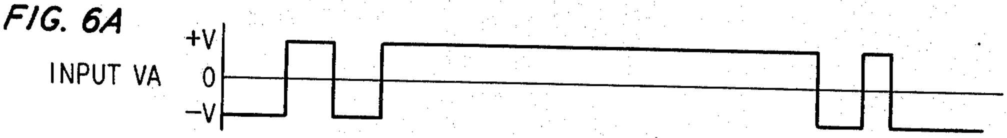
FIGS. 6A through 6D illustrate a sequence of waveforms useful in describing operation of the timer shown in FIG. 5.

As described above, equal operate and release intervals were achieved in a prior art timer by merely employing a fixed resistor between input terminal 20 and inverting input 17 of amplifier 12. Pulse position and pulse width error result in the output from comparator 11 in the prior timer arrangement when the signal applied to input terminal 20 is characterized by gaps, breaks or the like. Signals transmitted in a communications system, for example, dial pulses or the like, may be contaminated by noise caused by relay chatter or the like at both the leading and trailing edges of the pulse signals. FIG. 6A shows a pulse signal including breaks caused by noise which have been exaggerated in width for purposes of illustrating the operation of the embodiment of the invention shown in FIG. 5.

Accordingly, errors both in pulse position and pulse width in the delayed output pulse from comparator 11 are minimized, in this embodiment of the invention, by employing controllable impedance 15. In this example, impedance 15 includes three parallel paths, namely, resistor 50, series connection of resistor 51 and diode 52 and series connection of resistor 54 and diode 55. Diode 52 is poled to conduct only when a negative potential is applied to input 20. Similarly, diode 55 is poled to conduct only when a positive potential is applied to input 20. Thus, ignoring diodes 53 and 56 for the moment, resistor 51 is connected in parallel with resistor 50 during intervals that an input signal applied to terminal 20 is positive and resistor 54 is normally connected in parallel with resistor 50 during intervals that input 20 is a negative potential. Diode 53 is connected between a circuit junction of resistor 51 and diode 52 and output 30 of amplifier 25, namely, the output of comparator 11. Diode 53 is poled to inhibit conduction through diode 52 when the output of comparator 11 is positive. Similarly, diode 56 is connected between a circuit junction of resistor 54 and diode 55 and the output of comparator 11. Diode 56 is poled to inhibit conduction through diode 55 when the output of comparator 11 is negative. Thus, when the output from comparator 11 is positive and the signal applied to input 20 is positive, resistors 50 and 54 are connected in parallel, and when the output of comparator 11 is negative and the signal applied to input 20 is negative, resistors 50 and 51 are connected in parallel. In this example, the impedance values of resistors 50, 51 and 54 are selected so that the resultant parallel combinations are equal thereby yielding equal operate and release integration rates for integrator 10. Numerous other combinations of impedance elements and switching elements may be employed to obtain integration rates as desired. When the output from comparator 11 is positive and the signal applied to input 20 is negative and when the output from comparator 11 is negative and the signal applied to input 20 is positive, both resistors 51 and 54 are advantageously inhibited from being connected in parallel with resistor 50 via diodes 52 and 55 in conjunction with diodes 53 and 56, respectively. The latter situations occur during gaps or breaks in the signal applied to terminal 20 during the operate interval and release interval, respectively, of integrator 10. Consequently, the elements of impedance 15 in conjunction with the signal developed at output 30 of comparator 11 and applied input signal control the integration rate of integrator 10 during the delay intervals to minimize, in accordance with an aspect of this invention, errors in the resultant delayed pulse signal. That is to say, controllable impedance 15 responds to predetermined relationships of the applied input pulse signal and output pulse signal to controllably change the integration rate of integrator 10.

Figure 6B:
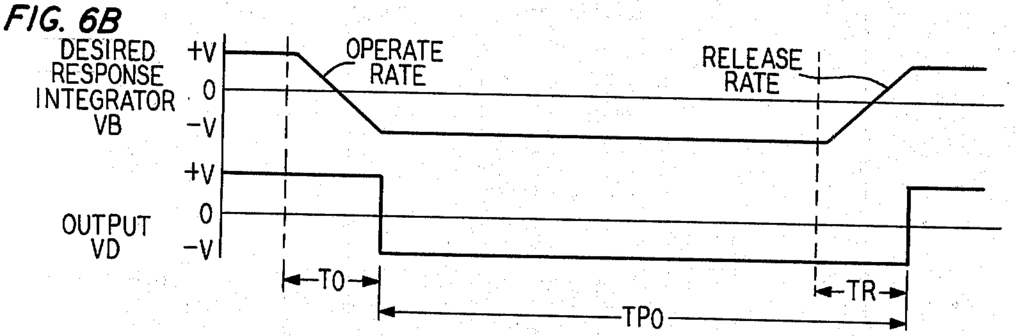
Figure 6C:
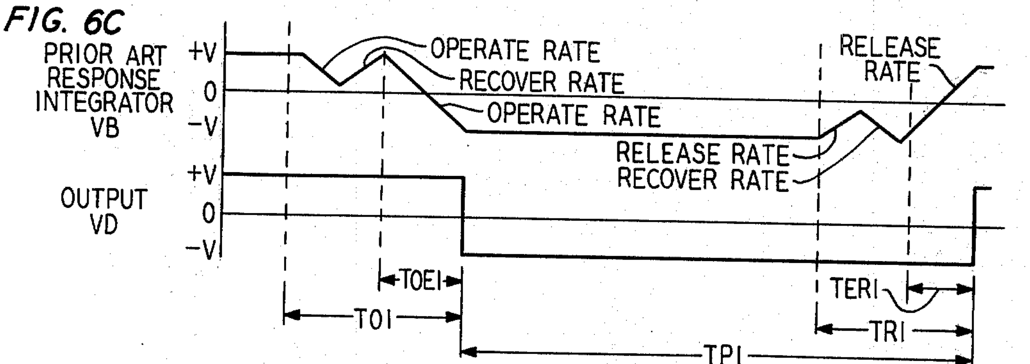
Figure 6D:
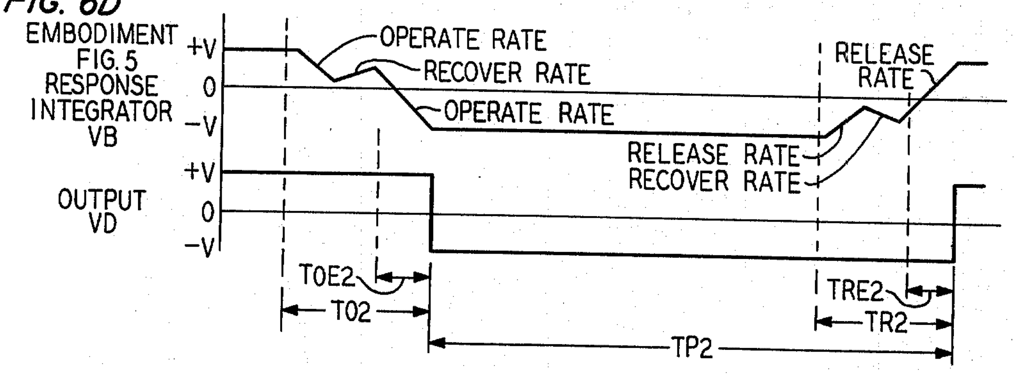

Operation of the embodiment shown in FIG. 5 to minimize pulse position and pulse width errors is best explained by referring to the sequence of waveforms shown in FIGS. 6A–6B. FIG. 6B depicts the desired responses of integrator 10 and comparator 11, namely VB and VD, respectively, assuming that there are no breaks in signal VA of FIG. 6A. As shown in waveform VD of FIG. 6B, operate interval TO is equal to release interval TR thereby yielding an output pulse having a width TP0. FIG. 6C illustrates responses VB and VD of integrator 10 and comparator 11, respectively, for the prior art timer in which the integration rate is constant during both the operate and release intervals. As shown in waveform VD of FIG. 6C, error intervals TOE1 and TRE1 result in the prior art output because of the breaks in waveform VA of FIG. 6A. These errors are minimized in the instant embodiment shown in FIG. 5 by advantageously changing the integration rate, i.e., time constant, of integrator 10 during intervals that breaks may possibly occur in the applied input signal. In this example, the integration rate is caused to decrease during the intervals in which breaks occur in signal VA. This is realized by inhibiting, connection of either resistor 51 or 54 in parallel with resistor 50 during the break intervals, thereby increasing the time constant of integrator 10. Consequently, response VB of integrator 10 shown in FIG. 6D is held substantially constant during the breaks in input signal VA and less time is lost in reaching the desired saturation potential of integrator 10, namely, potential −V. As is readily evident from an examination of output VD of comparator 11, as illustrated in FIG. 6D, the resultant error intervals TOE2 and TRE2 are less than intervals TOE1 and TRE1 shown in FIG. 6C for the prior art timer circuit.

The above described arrangements are, of course, merely illustrations of the application of the principles of the invention. Numerous other arrangements may be devised by those skilled in the art without departing from the spirit or scope of the invention, for example, use of other type switching elements may be equally employed to realize the desired changes in the charging and discharging time constants and, hence, the integration rate of integrator 10.

What is claimed is:

1. An analog timer of the type employed to generate an output pulse signal a predetermined time interval after application of an input pulse signal including an integrator circuit having a predetermined linear integration rate for developing a signal which is the mathematical integral of the input pulse signal and a comparator circuit responsive to the difference between a signal developed by the integrator and a reference signal for generating the delayed output pulse, wherein the improvement comprises:

controllable impedance means responsive to the comparator output and the applied input signal for changing the integration rate including a plurality of impedance elements having predetermined component values and means responsive to said applied input signal for connecting said impedance elements in predetermined circuit relationships; and means connected in circuit with said connecting means and being responsive to the comparator output for inhibiting said connection of said impedance elements during intervals that the comparator output is of predetermined polarity, wherein a change in the integrator integration rate is inhibited during said intervals.

2. An analog timer as defined in claim 1 wherein said impedance elements include at least first and second resistor means, said integrator includes a differential amplifier having an inverting input, noninverting input and output, said noninverting input being connected to a reference potential point, capacitor means being connected between said inverting input and said output, said comparator being connected to sense a signal developed at said inverting input of said amplifier, said at least first and second resistor means being connected in circuit relationship between an input of said timer and said inverting input of said amplifier, said connecting means including switching means connected in circuit with said first resistor means and being responsive to the instantaneous polarities of the input signal applied to said timer input controllably to connect said first resistor means in circuit with said inverting input during intervals that the input signal is of a prescribed polarity, and wherein said inhibiting means in connected in predetermined circuit relationship with said first resistor means and said switching means and is responsive to instantaneous polarities of the comparator output signal to inhibit said switching means from connecting said first resistor means in circuit with said inverting input during intervals that the comparator output is of a prescribed polarity.

3. An analog timer as defined in claim 2 wherein said switching means is a first diode poled to conduct current when said input signal is of said prescribed polarity and wherein said inhibiting means is a second diode connected to a circuit junction between said first resistor means and said first diode and is poled to clamp said circuit junction to a predetermined potential when the output signal from said comparator is of said prescribed polarity, thereby inhibiting conduction through said first diode.

4. An analog timer of the type employed to generate an output pulse signal a predetermined time interval after application of an input pulse signal which includes an integrator circuit having a predetermined linear integration rate for developing a signal which is the mathematical integral of the input pulse signal, and a comparator circuit responsive to a difference between a signal developed by the integrator and a reference signal for generating the delayed output pulse, wherein the improvement comprises:

means connected in circuit with the integrator and being responsive to the output signal developed by the comparator for controlling changes in the integration rate of the integrator including controllable impedance means responsive to the applied input pulse signal and the comparator output signal for controllably changing the integrator integration rate in accordance with prescribed relationships of the applied input pulse signal and comparator output signal.

5. An analog timer as defined in claim 4 wherein said controlling means includes means for inhibiting a change in the integrator integration rate during intervals that the output from the comparator has a predetermined polarity.

6. An analog timer of the type employed to generate an output pulse signal a predetermined time interval after application of an input pulse signal which includes an integrator circuit having a predetermined linear integration rate which is the mathematical integral of the applied input pulse signal and a comparator circuit responsive to the difference between a signal developed by the integrator and a reference signal for generating the delayed output pulse wherein the improvement comprises, controllable impedance means in circuit with the integrator and being responsive to the applied input signal and the comparator output signal including a plurality of impedance elements connectable in predetermined circuit relationships to obtain corresponding integration rates, and means responsive to the applied input signal and the comparator output signal for effecting connection of said elements in accordance with prescribed relationships between the input and output signals to obtain changes in the integrator integration rate.

7. An analog timer as defined in claim 6 wherein said integrator includes a differential amplifier having an inverting input, noninverting input and output, said noninverting input being connected to a reference potential point, capacitor means connected between said inverting input and said amplifier output, said comparator means being connected to sense a potential developed at said inverting input, said impedance elements including at least first, second and third resistor means being connected in circuit relationship with an input of said timer and said inverting input of said amplifier, said connecting means including first and second switching means connected in circuit with said first and second resistor means, respectively, and being responsive to instantaneous polarities of an input signal applied to said timer input controllably to connect said first and second resistor means in circuit between said timer input and said inverting input during intervals that the polarity of said input signal is of first and second polarities, respectively, first inhibiting means being connected in circuit relationship with said first resistor means and said first switching means and being responsive to the comparator output signal for inhibiting said first switching means from connected said first resistor means in circuit with said inverting input during intervals that the comparator output is of a first prescribed polarity and second inhibiting means being connected in circuit relationship with said second resistor means and said second switching means and being responsive to the comparator output signal for inhibiting said second switching means from connecting said second resistor means in circuit with said inverting input during intervals that the comparator output signal is of a second prescribed polarity.

8. An analog timer as defined in claim 7 wherein said first and second switching means are diodes poled to conduct current during intervals that said input signal is of said first and second polarities, respectively, and wherein said first and second inhibiting means are diodes poled to conduct current when the comparator output signal is of said first and second prescribed polarities, respectively, wherein said switching means and said inhibiting means respond to said input signal and said comparator output signal effectively to change the integration rate of the integrator in accordance with prescribed relationships between the polarities of said input signal and said comparator output.

* * * * *